United States Patent
Albert et al.

(12) 
(10) Patent No.: US 6,805,146 B2
(45) Date of Patent: Oct. 19, 2004

(54) ELECTRONIC-HYDRAULIC TRANSMISSION CONTROL MODULE AND MANUFACTURING METHOD

(75) Inventors: Roland Albert, Regensburg (DE); Christian Fritzsche, Regensburg (DE); Andreas Rekofsky, Alteglofsheim (DE); Ulf Scheuerer, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 189 days.

(21) Appl. No.: 10/116,537

(22) Filed: Apr. 4, 2002

(65) Prior Publication Data

US 2002/0157502 A1 Oct. 31, 2002

(30) Foreign Application Priority Data

Apr. 4, 2001 (DE) .......................................... 101 16 796

(51) Int. Cl.[7] .......................... F16K 43/00; F16K 37/00
(52) U.S. Cl. .................... 137/15.18; 137/554; 137/557; 137/884; 251/368

(58) Field of Search .................................. 137/554, 557, 137/884, 15.18; 251/368

(56) References Cited

U.S. PATENT DOCUMENTS

| | | | | |
|---|---|---|---|---|
| 4,392,375 A | * | 7/1983 | Eguchi et al. | 73/118.1 |
| 5,551,477 A | * | 9/1996 | Kanno et al. | 137/553 |
| 6,007,162 A | * | 12/1999 | Hinz et al. | 303/119.3 |
| 6,053,473 A | * | 4/2000 | Shinobu et al. | 251/129.19 |

FOREIGN PATENT DOCUMENTS

| | | |
|---|---|---|
| DE | 295 13 950 U1 | 2/1997 |
| DE | 198 34 212 A1 | 2/2000 |

* cited by examiner

*Primary Examiner*—A. Michael Chambers
(74) *Attorney, Agent, or Firm*—Laurence A. Greenberg; Werner H. Stemer; Gregory L. Mayback

(57) ABSTRACT

The electronic-hydraulic transmission control module has a hydraulic plate, an electronic control unit, and a sensor. The sensor is caulked into a wall of an opening in the hydraulic plate forming a plastic deformation.

8 Claims, 2 Drawing Sheets

ELECTRONIC-HYDRAULIC TRANSMISSION CONTROL MODULE AND MANUFACTURING METHOD

BACKGROUND OF THE INVENTION

Field of the Invention

The invention relates to an electronic-hydraulic transmission control module with an electronic control unit arranged on a hydraulic plate, and at least one sensor, in particular for a motor vehicle. The invention further pertains to a method for manufacturing such a transmission control module.

In prior art transmission control modules such as are used in automatic transmissions or in automated manual shift transmissions, sensors for measuring pressures in a hydraulic duct of a hydraulic plate normally have to be sealed twice in order to prevent hydraulic fluid from escaping. This pressure sensor is frequently integrated in a metallic base plate of the housing of an electronic control unit. This base plate is then mounted on a hydraulic plate, the pressure sensor projecting into a hydraulic duct of the hydraulic plate. A first O-ring is thus required between the pressure sensor and the opening in the base plate, and a second O ring is required between the base plate and the hydraulic plate.

Commonly assigned published patent application US 2001/011478 A1, and the corresponding German published patent application DE 198 34 212 A1, disclose a transmission control unit whose base plate has a hole wherein a pressure sensor is held in a pressure-tight and frictionally locking fashion. The base plate is in turn sealed with respect to a hydraulic unit using a seal. In order to achieve the pressure-tight attachment, the base plate must be made relatively thick at least in the region of the sensor.

German utility model DE 295 13 950 U1 relates to a transmission control unit which does not need a base plate. A circuit carrier that is fitted with the electronic control unit on its upper side and with a pressure sensor chip on its underside is arranged directly on a hydraulic unit. A duct in the hydraulic unit wherein hydraulic oil is located leads directly to the pressure sensor and is covered by it. Because the hydraulic oil is pressurized, forces are transmitted directly to the circuit carrier which is usually a ceramic substrate. In addition, it is difficult to seal off the duct from the surroundings.

SUMMARY OF THE INVENTION

It is accordingly an object of the invention to provide an electronic-hydraulic transmission control module and a manufacturing method for such a transmission control module, which overcome the above-mentioned disadvantages of the heretofore-known devices and methods of this general type and which permit simple and oil-tight integration of a sensor, which acquires states of the hydraulic fluid.

With the foregoing and other objects in view there is provided, in accordance with the invention, an electronic-hydraulic transmission control module, comprising:

a hydraulic plate formed with at least one duct for hydraulic fluid and with an opening having a wall;
an electronic control unit disposed on the hydraulic plate;
at least one solenoid valve connected to the electronic control unit for controlling the hydraulic fluid;
at least one sensor connected to the electronic control unit, the sensor being caulked in the wall of the opening, forming a plastic deformation.

Since the sensor is inserted directly into the hydraulic plate, it is possible to dispense with a seal between a base plate of an electronic module and the hydraulic plate. By caulking or pressing the sensor into the hydraulic plate it is also possible to dispense with a seal between the wall of the opening in the hydraulic plate and the sensor. There is therefore no need either for sealing elements or for parts for attaching the sensor.

In accordance with an added feature of the invention, the sensor has a body formed with at least one circumferential depression in which deformed material of the wall brings about frictional engagement (force lock) and a form lock (positive lock) with the body.

In accordance with an additional feature of the invention, the electronic control unit has a circuit carrier mounted directly on the hydraulic plate.

In accordance with another feature of the invention, a cover is sealed to the hydraulic plate and encloses the electronic control unit and the sensor.

In accordance with a further feature of the invention, at least one solenoid valve is attached to the hydraulic plate and disposed outside and spaced apart from the cover.

In accordance with again an added feature of the invention, the body of the sensor is composed of a steel alloy, and the hydraulic plate is composed of aluminum, polyamide, or polybutylene therephtalate. That is, if the material of the hydraulic plate is meant to deform during the caulking of the sensor, steel is particularly suitable as a material for the body or the housing of the sensor and aluminum, polyamide (PA66) or polybutylene therephtalate (PBT) is suitable as the material for the hydraulic plate. On the other hand, if the body of the sensor is meant to deform, its material must be more readily deformable than that of the hydraulic plate.

With the above and other objects in view there is also provided, in accordance with the invention, a method of manufacturing an electronic-hydraulic transmission control module. The method comprises the following steps:

providing an hydraulic plate formed with an opening having a given width and a sensor having a larger width (i.e., clearing dimension) than the given width (clearing dimension) of the opening;
caulking the sensor with the larger width in the opening;
mounting an electronic control unit on the hydraulic plate; and
producing an electrical connection between the sensor and the electronic control unit.

In accordance with a concomitant feature of the invention, the opening and the sensor are substantially round, and the width and the given width are diameters.

The sensor is preferably a pressure sensor, a rotational speed sensor or a temperature sensor which takes measurements within an automatic motor vehicle transmission or within an automated manual shift transmission.

Other features which are considered as characteristic for the invention are set forth in the appended claims.

Although the invention is illustrated and described herein as embodied in en electronic-hydraulic transmission control module and manufacturing method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
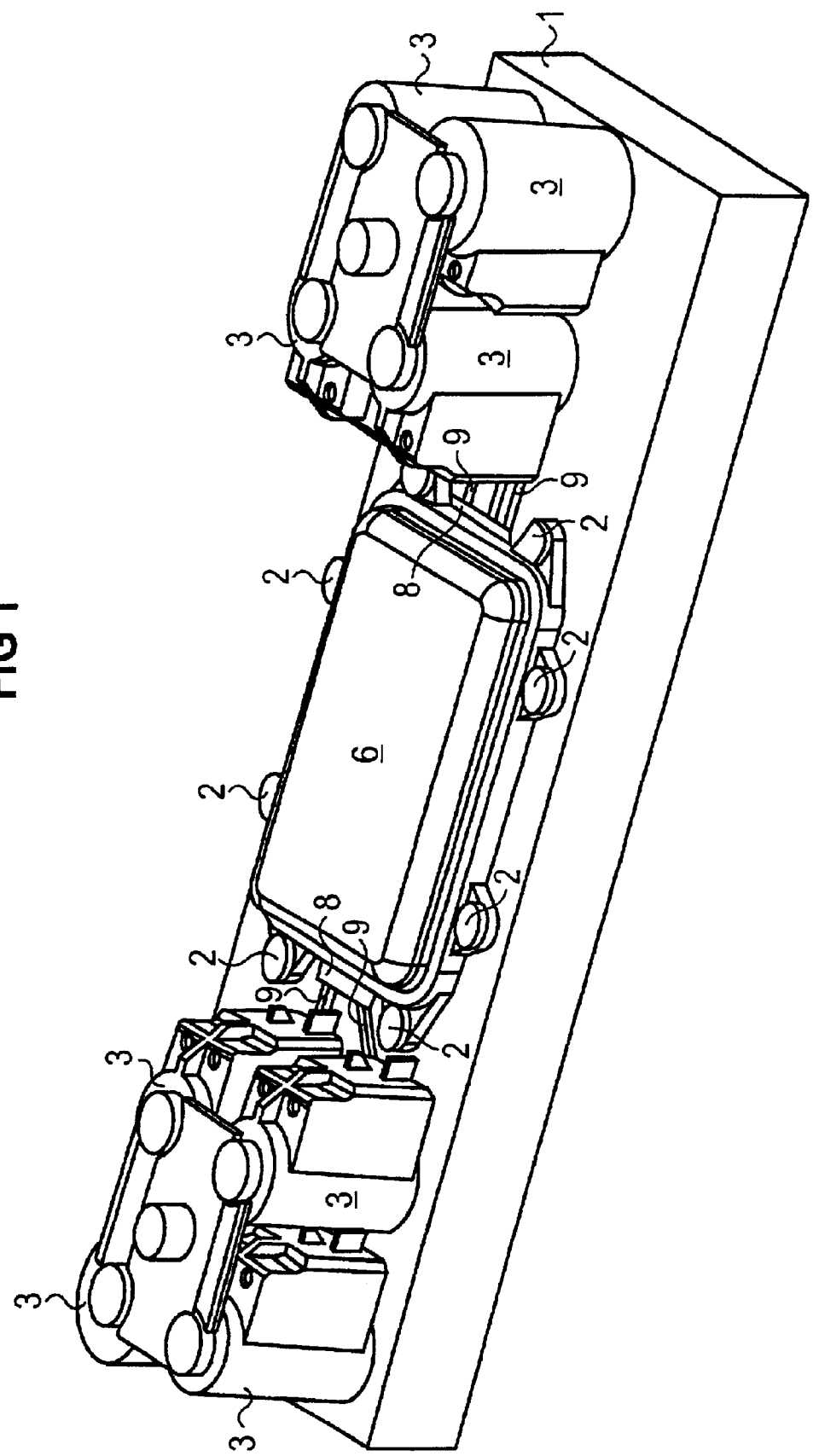
FIG. 1 is a perspective view of an electronic-hydraulic transmission control module.

Referring now to the figures of the drawing in detail and first, particularly, to FIG. 1 thereof, there is shown an electronic-hydraulic transmission control module of an automatic transmission of a motor vehicle which is located within its oil sump or oil pan. The transmission control module is composed of a hydraulic plate 1 or hydraulic unit with at least one duct for fluid for the transmission of pressure, of two valve assemblies with four solenoid valves 3 each and of an electronic control unit that is protected by a cover 6.

The solenoid valves 3 are each inserted into holes in the hydraulic plate 1 that communicate with the (pressure medium) duct or ducts. The hydraulic plate 1 forms a housing wall which protects the electronic control unit against environmental influences.

The hood-like or trough-shaped cover 6 of the housing which protects the electronic control unit is attached directly to the hydraulic plate 1 by way of attachment elements 2, for example screws or rivets. A flexible printed circuit board 8 is laminated onto the hydraulic plate 1 and connects the solenoid valves 3 arranged outside the housing cover 6 to the electronic control unit arranged within the cover. The electronic control unit is sealed off from the outside with respect to the transmission oil by a seal that runs between the cover 6 and the hydraulic plate 1. The electrical connection between the conductors of the printed circuit board 8 and the solenoid valves 3 is made via metallic conductors 9 that are integrated into the hydraulic plate 1. The hydraulic plate 1 is composed of plastic.

Figure 2:
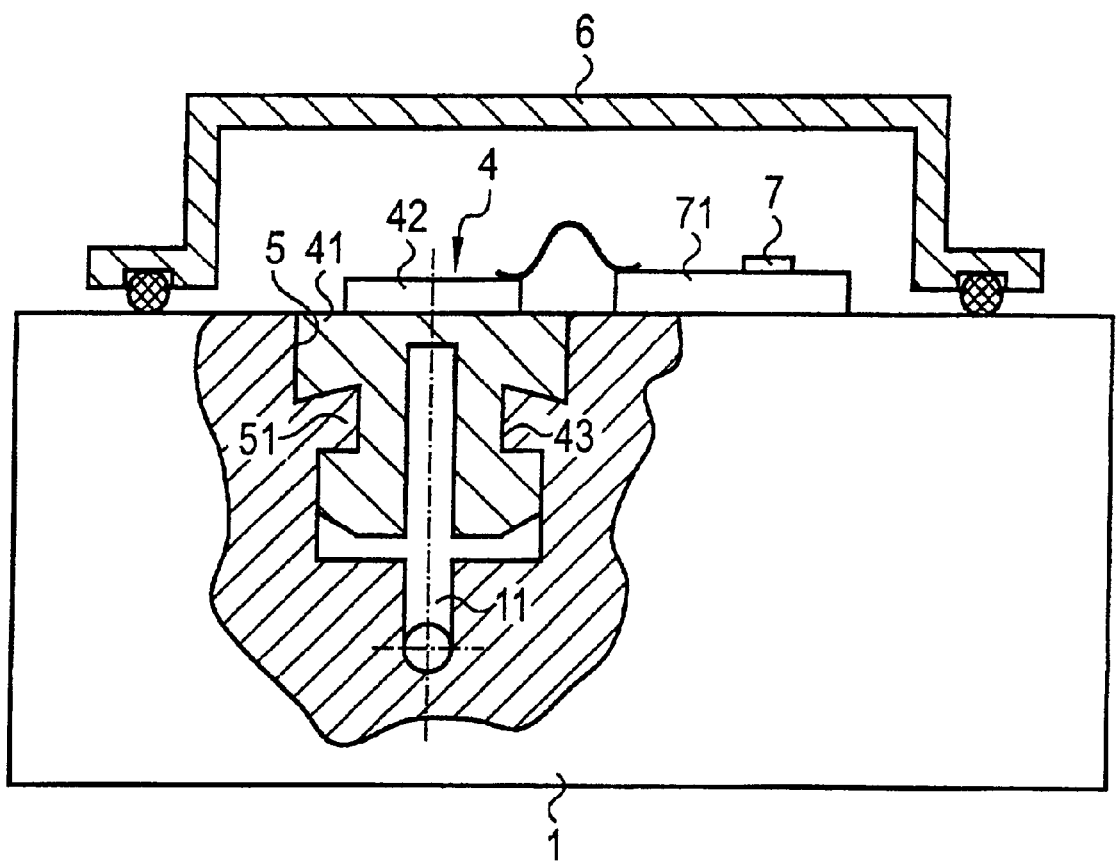
FIG. 2 is a schematic sectional view of an electronic-hydraulic transmission control module.

Referring now to FIG. 2, there is shown the electronic control unit 7 which is arranged on a circuit carrier 71, namely a ceramic substrate. The electronic control unit 7 is sealed off from the environment within the hood-like, trough-shaped cover 6, in the same way as a sensor 4. The cover therefore hermetically seals off an internal space for the electronics. The circuit carrier 71 with the electronic control unit 7 is directly bonded onto the surface of the hydraulic plate 1.

The sensor 4 is composed of a body 41 or carrier made of steel which terminates essentially flush with the surface of the hydraulic plate 1 and is inserted in a hole or opening 5 in the hydraulic plate 1. A semiconductor chip 42 which measures pressures prevailing in a duct 11 for hydraulic fluid and outputs electrical signals is arranged on the sensor body 41. The semiconductor chip 42 of the sensor 4 is in electrical contact with the electronic control unit 7 or the circuit carrier 71 via a bonded connection, i.e., a bond wire connection. The sensor 4 supplies measured values to the control circuit 7 which permit the latter to control or regulate the pressure of the pressure medium or the hydraulic fluid in the duct 11.

The sensor body 41 has a depression 43 which runs completely around it or an annular groove opposite the rest of the sensor body or a circumferential projection. The depression 43 forms an undercut. During the caulking or pressing of the sensor 4 into the opening 5 of the hydraulic plate 1, a plastic deformation of the material of the hydraulic plate 1 is produced because the diameter of the sensor body 41 has a greater diameter along at least one section than the opening 5. In this case, the material from the hydraulic plate flows into the depression and forms a positively engaging lock (i.e., a form lock) with the sensor body 41 at the undercut or in the depression 43. Interlocking therefore occurs between a wall 51 of the opening 5 and the sensor body. In addition, the material of the hydraulic plate 1 is pressed against at least one circumferential section of the sensor body which is oriented in the direction wherein the sensor body 41 is introduced into the opening 5. For this reason, both a positively engaging lock and a frictionally engaging lock (i.e., a force lock) are produced between the sensor body 41 and the wall 51 of the opening 5. As a result, the sensor 4 is sealed off with respect to the wall 51 so that the ingress of oil into the interior space wherein the electronics are housed is reliably prevented.

Alternatively, the body 41 of the sensor can also be deformed.

We claim:

1. A method of manufacturing an electronic-hydraulic transmission control module, which comprises the following method steps:

providing an hydraulic plate formed with an opening having a given width and a sensor having a larger width than the given width of the opening;

caulking the sensor with the larger width in the opening;

mounting an electronic control unit on the hydraulic plate; and producing an electrical connection between the sensor and the electronic control unit.

2. The method according to claim 1, wherein the opening is substantially round, the sensor is substantially round, and the width and the given width are diameters.

3. An electronic-hydraulic transmission control module, comprising:

a hydraulic plate formed with at least one duct for hydraulic fluid and with an opening having a wall;

an electronic control unit disposed on said hydraulic plate;

at least one solenoid valve connected to said electronic control unit for controlling the hydraulic fluid;

at least one sensor connected to said electronic control unit, said sensor being caulked in said wall of said opening, forming a plastic deformation.

4. The transmission control module according to claim 3, wherein said sensor has a body formed with at least one circumferential depression in which deformed material of said wall brings about frictional engagement and a form lock with said body.

5. The transmission control module according to claim 3, wherein said electronic control unit has a circuit carrier mounted directly on said hydraulic plate.

6. The transmission control module according to claim 3, which comprises a cover sealed to said hydraulic plate and enclosing said electronic control unit and said sensor.

7. The transmission control module according to claim 6, which comprises at least one solenoid valve attached to said hydraulic plate and disposed outside and spaced apart from said cover.

8. The transmission control module according to claim 4, wherein said body of said sensor is composed of a steel alloy, and said hydraulic plate is composed of a material selected from the group consisting of aluminum, polyamide, and polybutylene therephtalate.

* * * * *